United States Patent [19]

Peters

[11] 3,723,834

[45] Mar. 27, 1973

[54] SEMICONDUCTOR DEVICE HAVING A CLOSED CONDUCTIVE RUBBER RING CLAMPED AROUND ALL ELECTRIC CONDUCTORS

[75] Inventor: Geradus Johannes Anthonius Peters, Nijmegen, Netherlands

[73] Assignee: U.S. Philips Corporation, New York, N.Y.

[22] Filed: July 27, 1971

[21] Appl. No.: 166,611

Related U.S. Application Data

[63] Continuation of Ser. No. 779,474, Nov. 27, 1968, abandoned.

[52] U.S. Cl..........317/234 R, 317/234 E, 317/234 G, 317/235 A, 206/46 ED

[51] Int. Cl................................H01l 3/00, H01l 5/00

[58] Field of Search......317/234, 1, 2, 3, 4, 4.1, 21.1; 206/46 ED; 330/38 FE

[56] References Cited

UNITED STATES PATENTS 3,278,455 10/1966 Feather................................252/512
3,332,867 7/1967 Miller et al...........................204/197
3,332,867 7/1967 Miller et al...........................252/512

FOREIGN PATENTS OR APPLICATIONS 558,080 12/1943 Great Britain........................252/512
1,106,878 5/1961 Germany.............................317/234

OTHER PUBLICATIONS

Solid State, Popular Electronics, April, 1967, pages 85 and 106.

*Primary Examiner*—John W. Huckert
*Assistant Examiner*—Andrew J. James
*Attorney*—Frank R. Trifari

[57] ABSTRACT

A semi-conductor device including a housing for a semi-conductor body of the field-effect type having an insulating gate electrodes and electric conductors which emerge from the housing and are located in a circle. The conductors are surrounded by a closed, flexible ring of an electrically conductive rubber material such as electrically conductive silicon rubber, e.g., a rubber mixed with electrically conductive particles. This ring is so flexible that it contacts all of the conductors without substantially bending them.

3 Claims, 4 Drawing Figures

INVENTOR.
GERARDUS JOHANNES A. PETERS
BY
AGENT

SEMICONDUCTOR DEVICE HAVING A CLOSED CONDUCTIVE RUBBER RING CLAMPED AROUND ALL ELECTRIC CONDUCTORS

This application is a streamline continuation of application Ser. No. 779,474, filed 11-27, 1968, and now abandoned.

The invention relates to a semiconductor device comprising a housing, a semiconductor body consisting of a field-effect transistor of the type having an insulated gating electrode, and electric conductors which emerge on one side of the housing and are located at least in situ on the periphery of a circle. One of the best known semiconductor devices of this type is indicated by the name of MOST.

In such field-effect transistors the dielectric layer located between the gating electrodes and the substrate may be damaged prior to and during connection in an electric circuit. This damage may occur by too great a potential difference between the gating electrode and the substrate which difference may arise as a result of static charge. A too great potential difference may alternatively be caused, for example, by a possible voltage on a soldering iron during soldering the conductors in an electric circuit. As a result defects arise in the transistor originally approved and before this transistor is operative in an electric circuit.

An object of the invention is to provide a semiconductor device of the above-mentioned type in which the said possibility of damage will not occur. According to the invention to achieve this object a flexible, closed ring is provided which surrounds the electric conductors and which consists of an electrically conductive material, while the periphery and the flexibility of the ring are such that it makes contact with all electric conductors, but does not substantially bend these conductors.

The closed ring clamps around all electric conductors and since one of the conductors is connected to the housing there is a short circuit between the gating electrode, possibly gating electrodes, and the housing of the semiconductor device as long as the electrically conductive ring is present, so that breakdown in the dielectric layer cannot occur. Particularly in a semiconductor device having more than three electric conductors this solution is very attractive and safe in operation. Deformation of the conductors does not occur since the force exerted by the ring on the conductors is only very small. Thus, assembly of the semiconductor device in a printed circuit can be carried out very easily. Furthermore, this construction provides the possibility to solder the conductors of the semiconductor device together with the ring in an electric circuit so that also during soldering no damage can occur. The conducting flexible ring may then be removed in a simple manner after soldering, for example, by cutting it.

In a preferred embodiment according to the invention the electrically conducting ring consists of electrically conductive silicone rubber having a resistance at a maximum of 15 ohm-cm. This ring can simply be manufactured, is cheap and provides a certain guarantee for preventing damage of the dielectric layer.

In a further embodiment according to the invention the electrically conducting flexible ring is provided near the area where the electric conductors emerge from the housing. This is advantageous both for preventing bending of the conductors and for facilitating easy mounting and soldering in a printed circuit.

The invention will now be described with reference to the accompanying diagrammatic drawing, in which.

Figure 1:
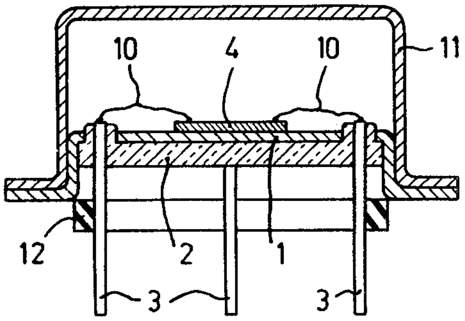
FIG. 1 is a cross-sectional view of a semiconductor device including a field-effect transistor having an insulated gating electrode.
Figure 2:
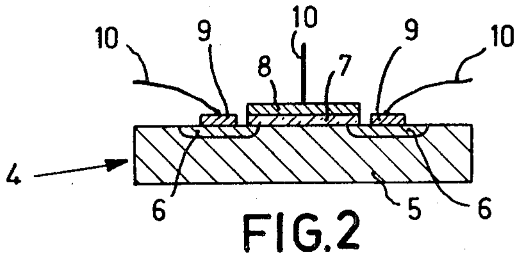
FIG. 2 is at a larger scale a cross-sectional view of the semiconductor body.

FIG. 1 shows a semiconductor device comprising a metal base 1, for example, of copper in which a plurality of electric conductors 3 are hermetically secured with the aid of a glass seal 2. A semiconductor body 4 is secured to the base in a known electrically conducting manner. The semiconductor body 4 is shown on a larger scale in FIG. 2. It consists of a *p*-type substrate 5, for example, of monocrystalline silicon having a high specific resistance in which two $N^+$ surface areas 6 of low specific resistance are provided. A thin dielectric layer 7, for example, of silicon dioxide extends across the *p-n* junctions between the $N^+$ areas 6 and the substrate 5. A metal layer 8, for example, of aluminum acting as a control electrode is provided on the dielectric layer 7. Resistive contacts 9, for example, of aluminum are provided on the areas 6. The resistive contacts 9 and the control electrodes 8 are connected through current conductors 10 to the electric conductors 3 which emerge from the housing. During operation a voltage is set up between the two areas 6. The flow of current between these areas may be started and controlled by a voltage which is set up between the gating electrode and the semiconductor body lying underneath.

The base 1 is hermetically closed with the aid of a cap 11 which is secured to the base by means of, for example, cold welding. A further electric conductor which makes electrical contact with the base 1 and hence with the cap 11 and the substrate 5 is secured to the base 1.

Figure 3:
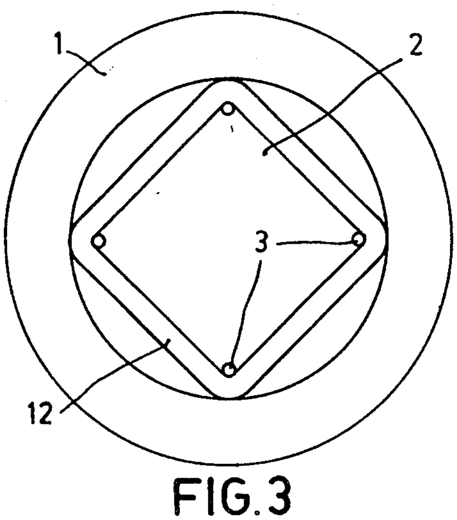
FIG. 3 is a bottom view of a housing from which four electric conductors emerge.
Figure 4:
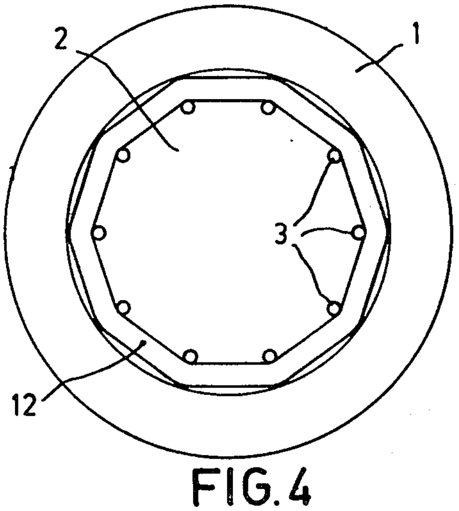
FIG. 4 is a bottom view of a housing from which ten electric conductors emerge, for a field-effect transistor which includes a plurality of insulating gating electrodes.

A ring 12 of flexible material which is electrically conductive is provided around the conductors 3 so that these conductors are mutually short-circuited electrically. FIG. 3 is a bottom view of such a semiconductor device having four conductors 3 and FIG. 4 is a bottom view in which ten electric conductors emerge from the base. In the latter construction a plurality of gating electrodes is provided, each gating electrode being connected to separate electric conductors. Field-effect transistors having a plurality of gating electrodes are known per se and are not further described here.

The ring 12 preferably consists of an electrically conductive silicone rubber having a specific resistance at a maximum of 15 ohm-cm. Since the conductors 3 are arranged in a circular configuration the electrically conducting flexible ring will always engage all pins and thus form a short-circuit in the semiconductor circuit. As a result it will not be possible for a potential difference to arise between the housing and the gating electrode so that damage of the dielectric layer will not occur.

By furthermore providing the ring 12 near the lower side of the housing as shown in FIG. 1, a simple insertion of the electric conductors in apertures of a printed circuit board is possible. The force exerted by the ring 12 on the electric conductors 3 need only be small so that the desired mutual positions of the conductors will not be influenced. After soldering the conductors in position in an electric circuit the ring 12 may be removed in a simple manner, for example, by cutting it. Thus the short circuit between the different components of the field-effect transistor will remain until after soldering or otherwise securing of the semiconductor device in an electric circuit.

It will be evident that the drawing shows only one embodiment of a field-effect transistor having an insulated gating electrode. The field-effect transistor may of course have any suitable structure. Furthermore, the plurality of electric conductors 3 is adapted to this structure of the transistor.

What is claimed is:

1. A semiconductor device comprising a housing, a semiconductor body consisting of a field-effect transistor of the type having an insulating gating electrode, and electric conductors connected to said semiconductor body which emerge on one side of the housing and are located at least in situ on the periphery of a circle, and a closed resilient ring surrounding the electric conductors consisting of an electrically conductive rubber material, the ring having such a resiliency that it contacts all of said electric conductors without substantially bending the electric conductors.

2. A semiconductor device as claimed in claim 1, wherein the electrically conducting ring consists of electrically conductive silicone rubber having a specific resistance at a maximum of 15 ohm-cm.

3. A semiconductor device as claimed in claim 2, wherein the electrically conducting flexible ring is provided near the area where the electric conductors emerge from the housing.

* * * * *